United States Patent
Ohtsuka et al.

(10) Patent No.: US 7,999,398 B2
(45) Date of Patent: Aug. 16, 2011

(54) SOLID STATE DEVICE

(75) Inventors: Masaaki Ohtsuka, Saitama-ken (JP); Naruhito Sawanobori, Saitama-ken (JP); Kazuya Aida, Saitama-ken (JP); Hiroki Watanabe, Saitama-ken (JP); Yoshinobu Suehiro, Aichi-ken (JP); Seiji Yamaguchi, Aichi-ken (JP); Koji Tasumi, Aichi-ken (JP)

(73) Assignees: Toyoda Gosei Co., Ltd., Nishikasugai-Gun, Aichi-Ken (JP); Sumita Optical Glass, Inc., Saitama-Shi, Saitama-Ken (JP)

( * ) Notice: Subject to any disclaimer, the term of this patent is extended or adjusted under 35 U.S.C. 154(b) by 1048 days.

(21) Appl. No.: 11/882,601

(22) Filed: Aug. 2, 2007

(65) Prior Publication Data
US 2008/0029780 A1    Feb. 7, 2008

(30) Foreign Application Priority Data

Aug. 3, 2006 (JP) ................. 2006-212633
Apr. 20, 2007 (JP) ................. 2007-112273
Jul. 23, 2007 (JP) ................. 2007-190627

(51) Int. Cl.
*H01L 23/28* (2006.01)

(52) U.S. Cl. . 257/794; 257/100; 257/433; 257/E23.118; 257/E31.117; 257/E33.059

(58) Field of Classification Search ............... 257/100, 257/433, 794, E23.118, E31.117, E33.059
See application file for complete search history.

(56) References Cited

U.S. PATENT DOCUMENTS

| | | | | |
|---|---|---|---|---|
| 7,208,430 | B2* | 4/2007 | Hasegawa et al. | 501/15 |
| 7,667,223 | B2* | 2/2010 | Suehiro et al. | 257/10 |
| 7,692,259 | B2* | 4/2010 | Suehiro | 257/431 |
| 2003/0158030 | A1* | 8/2003 | Yamamoto et al. | 501/64 |
| 2003/0228471 | A1* | 12/2003 | Hayakawa et al. | 428/426 |
| 2004/0018931 | A1* | 1/2004 | Sridharan et al. | 501/21 |
| 2006/0049421 | A1* | 3/2006 | Suehiro et al. | 257/99 |
| 2009/0115335 | A1* | 5/2009 | Hasegawa et al. | 313/586 |
| 2009/0131240 | A1* | 5/2009 | Shimizu | 501/78 |
| 2009/0143214 | A1* | 6/2009 | Niida et al. | 501/56 |
| 2009/0176641 | A1* | 7/2009 | Kobayashi et al. | 501/78 |

FOREIGN PATENT DOCUMENTS

| | | |
|---|---|---|
| JP | 8-102553 | 4/1996 |
| JP | 11-177129 | 7/1999 |
| JP | 2006-108621 | 4/2006 |

* cited by examiner

*Primary Examiner* — Anh Phung
*Assistant Examiner* — Michael Lulis
(74) *Attorney, Agent, or Firm* — McGinn IP Law Group, PLLC

(57) ABSTRACT

A solid state device has a solid state component, a power receiving/supplying portion that mounts the solid state component thereon for receiving/supplying electrical power from/to the solid state component, and a glass sealing portion that seals the solid state component. The glass sealing portion is formed of a $B_2O_3$—$SiO_2$—$Li_2O$—$Na_2O$—$ZnO$—$Nb_2O_5$ based glass, which is composed of 21 wt % to 23 wt % of $B_2O_3$, 11 wt % to 13 wt % of $SiO_2$, 1 wt % to 1.5 wt % of $Li_2O$, and 2 wt % to 2.5 wt % of $Na_2O$.

24 Claims, 8 Drawing Sheets

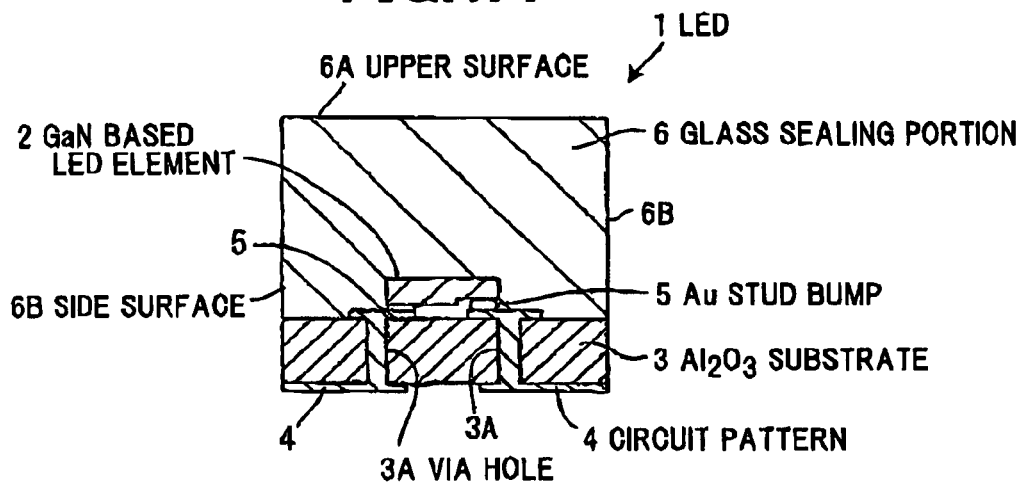
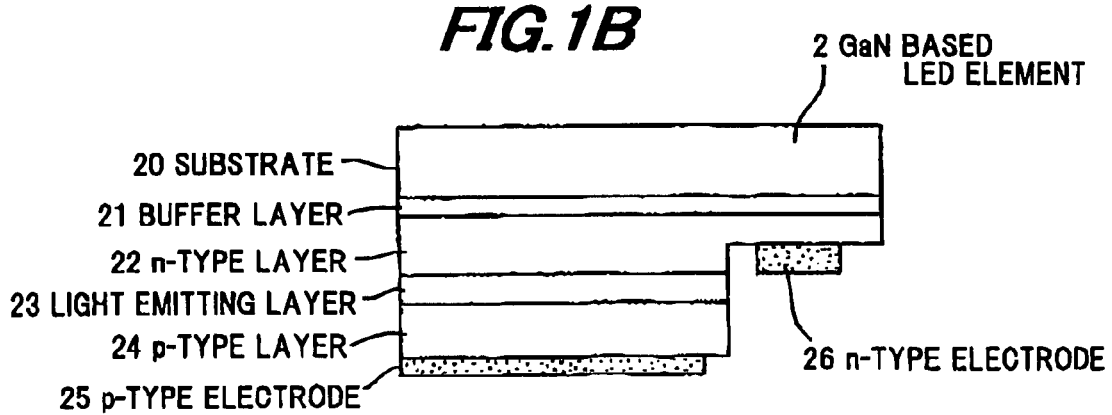

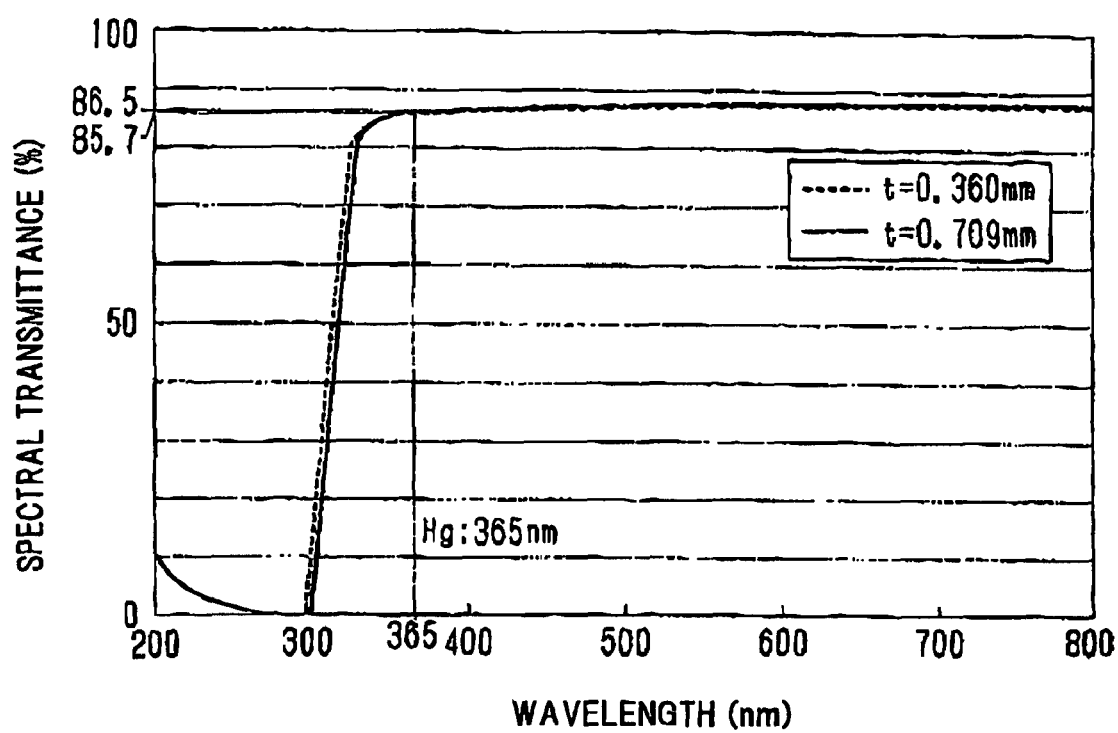

SOLID STATE DEVICE

The present application is based on Japanese patent application No. 2006-212633, 2007-112273 and 2007-190627, the entire contents of which are incorporated herein by reference.

BACKGROUND OF THE INVENTION

1. Field of the Invention

This invention relates to a solid state device equipped with a solid state component sealed with a glass material.

2. Description of the Related Art

Conventionally, solid state devices are known which is equipped with a solid state component such as an light emitting diode (LED) element sealed with a transparent resin material such as an epoxy resin. The solid state devices have the problem that the transparent resin deteriorates due to light emitted from the solid state component. In particular, when a group III nitride compound semiconductor to emit light with a short wavelength is used as the solid state component, the transparent resin near the component turns yellow due to high energy light emitted from the component and heat generated from the component itself, so that the light emission efficiency may be reduced with time.

In order to prevent the sealing material from deteriorating, a light emitting device using a glass material as a sealing material is proposed (e.g., JP-A-08-102553 and JP-A-11-177129).

JP-A-08-102553 discloses a light emitting device that an LED element, a wire bonding portion and the periphery of the top portion of a lead are covered with a transparent sealing material made of a glass material. The glass material includes selenium, thallium, arsenic, sulfur etc. added to yield a melting point of 130 to 350° C.

JP-A-11-177129 discloses a light emitting device that a GaN based LED element with a refractive index of about 2.3 is sealed with a low-melting glass with a refractive index of about 2. In this light emitting device, by using the GaN based LED element and the low-melting glass with the refractive index described above, a light to be totally reflected on the interface between the LED element and the low-melting glass can be reduced.

However, the solid state devices in JP-A-08-102553 and JP-A-11-177129 need to be produced by processing the still hard glass material even when using the low-melting glass so that it is impossible to realize the devices by using the conventional resin sealing process. Further, properties and components necessary for realizing the device are not known yet.

Therefore, the inventors checked up issues in realizing the inorganic material sealing process and solved them, where a light emitting device is proposed that can actually obtain effects expected by the glass sealing (e.g., JP-A-2006-108621). JP-A-2006-108621 discloses the light emitting device that is composed of a substrate made of a ceramic material, and a glass sealing portion which is made of a $B_2O_3$—$SiO_2$—$Na_2O$—$ZnO$—$Nb_2O_5$ based glass comprising 19 wt % to 30 wt % of $B_2O_3$, 0.5 wt % to 15 wt % of $SiO_2$, 1.5 wt % to 8 wt % of $Na_2O$, 44 wt % to 60 wt % of ZnO, and 9 wt % to 19 wt % of $Nb_2O_5$. Thus, the glass sealing portion can be prevented from peeling from the substrate and from causing cracks, so that the stable bonding strength between the substrate and the glass sealing portion can be secured. Further, it is confirmed that the glass sealing portion can be prevented from causing a loss in transparency due to crystallization thereof.

Thus, JP-A-2006-108621 teaches the glass material composition to provide the stable glass sealing portion. Further, the inventors have made researches on the weather resistance of the glass sealing portion in addition to the stability so as to improve the durability of the solid state device.

SUMMARY OF THE INVENTION

It is an object of the invention to provide a solid state device that the glass sealing portion thereof can have good weather resistance as well as stability.

According to one embodiment of the invention, a solid state device comprises:

a solid state component;

a power receiving/supplying portion that mounts the solid state component thereon for receiving/supplying electrical power from/to the solid state component; and a glass sealing portion that seals the solid state component and comprises a $B_2O_3$—$SiO_2$—$Li_2O$—$Na_2O$—$ZnO$—$Nb_2O_5$ based glass, wherein the glass comprises 21 wt % to 23 wt % of $B_2O_3$, 11 wt % to 13 wt % of $SiO_2$, 1 wt % to 1.5 wt % of $Li_2O$, and 2 wt % to 2.5 wt % of $Na_2O$.

In the above embodiment, the following modifications and changes can be made.

(i) The glass comprises 48 wt % to 51 wt % of ZnO, and 11.5 wt % to 12 wt % of $Nb_2O_5$.

(ii) The glass comprises 3.5 wt % to 4 wt % of $Li_2O$ and $Na_2O$ in sum content.

(iii) The glass comprises a yielding point of not more than 540° C.

(iv) The glass comprises a thermal expansion coefficient of not more than $7.0 \times 10^{-6}$/° C.

(v) The glass sealing portion and the solid state component satisfy a relationship between thermal expansion coefficients thereof that a ratio of a lower one of the thermal expansion coefficients to a higher one thereof is not less than 0.85.

(vi) The solid state component comprises a size of not less than 1 mm.

(vii) The power receiving/supplying portion compactly mounts a plurality of the solid state components thereon.

(viii) The solid state component is flip-chip mounted.

(ix) The solid state device further comprises two bumps through which the solid state component is mounted, the bumps each being formed at an anode side and at a cathode side.

(x) The power receiving/supplying portion comprises an inorganic material substrate comprising a conductive pattern to receive/supply an electrical power from/to the solid state component, and the glass sealing portion and the solid state component satisfy a relationship between thermal expansion coefficients thereof that a ratio of a lower one of the thermal expansion coefficients to a higher one thereof is not less than 0.85.

(xi) The inorganic material substrate comprises a first conductive pattern formed on a mounting side of the solid state component, a second conductive pattern formed on an opposite side of the mounting side, and a third conductive pattern electrically connecting the first conductive pattern with the second conductive pattern.

(xii) The inorganic material substrate comprises an alumina substrate.

(xiii) The glass sealing portion comprises a coating material that comprises humidity resistance, acid resistance and alkali resistance, and is formed on a surface thereof.

(xiv) The solid state component comprises an optical element, and the glass sealing portion comprises a transparent material.

(xv) The optical element comprises a light emitting element.

(xvi) The glass sealing portion comprises a phosphor dispersed therein to emit a wavelength conversion light when excited by light emitted from the light emitting element.

(xvii) The glass sealing portion comprises an internal transmittance of not less than 90% per 1 mm thickness to light with a wavelength of 350 nm to 800 nm.

(xviii) The glass sealing portion comprises a refractive index of not less than 1.6.

(xix) The light emitting element comprises a GaN based LED element comprising a growth substrate and a GaN based semiconductor layer formed on the growth substrate.

(xx) The growth substrate comprises a refractive index of not less than 1.8.

(xxi) The optical element comprises a light receiving element.

(xxii) The glass sealing portion is overmolded by a resin at a surface thereof.

(xxiii) The glass further comprises $Bi_2O_3$.

ADVANTAGES OF THE INVENTION

According to the invention, a solid state device allows the glass sealing portion to have good weather resistance as well as stability. Therefore, even when the solid state device is used under a harsh environment for long hours, the solid state device can be effectively prevented from time deterioration in light extraction efficiency since the glass sealing portion has the good weather resistance.

BRIEF DESCRIPTION OF THE DRAWINGS

The preferred embodiments according to the invention will be explained below referring to the drawings, wherein:

FIG. 1A is a longitudinal cross sectional view showing an LED as a solid state device in a first preferred embodiment according to the invention;

FIG. 1B is a side view showing an LED element in FIG. 1A;

FIG. 2 is a graph showing a relationship between wavelength and spectral transmittance of two samples prepared from Sample 12;

DETAILED DESCRIPTION OF THE PREFERRED EMBODIMENTS

First Embodiment

Figure 3A:
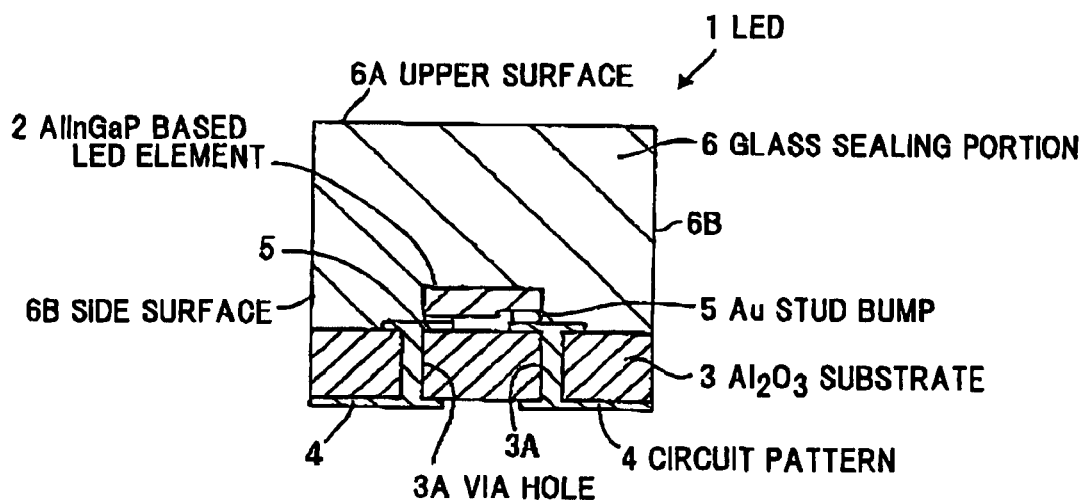
FIG. 3A is a longitudinal cross sectional view showing an LED in a modification of the first preferred embodiment according to the invention.

FIG. 1A is a longitudinal cross sectional view showing an LED as a solid state device in the first preferred embodiment according to the invention, and FIG. 1B is a side view showing an LED element in FIG. 1A.

Composition of LED 1

As shown in FIG. 1A, an LED (=light emitting diode) 1 as a solid state device is composed of a flip-chip type LED element 2 formed of a GaN based semiconductor material, an $Al_2O_3$ substrate 3 as an inorganic material substrate mounting the LED element 2 thereon, a circuit pattern 4 made of tungsten (W)-nickel Ni)-gold (Au) formed on the $Al_2O_3$ substrate 3, an Au stud bump 5 electrically connecting the LED element 2 and the circuit pattern 4, and a glass sealing portion 6 as a transparent inorganic sealing portion for sealing the LED element 2 while being bonded to the $Al_2O_3$ substrate 3. In this embodiment, the $Al_2O_3$ substrate 3 and the circuit pattern 4 constitute a power-receive/supply portion form mounting the LED element 2 thereon and receiving/supplying electrical power from/to the LED element 2.

As shown in FIG. 1B, the LED element 2 is composed of, sequentially grown on a growth substrate 20 of sapphire ($Al_2O_3$), a buffer layer 21, an n-type layer 22, a light emitting layer 23, and a p-type layer 24. Further, the LED element 2 is composed of a p-type electrode 25 disposed on the surface of the p-type layer 24, and an n-type electrode 26 disposed on the n-type layer 22 which is exposed by etching partially the p-type layer 24 through the n-type layer 22. The LED element 2 is epitaxially grown at a temperature not less than 700° C., provided with an upper temperature limit not less than 600° C., and stable against a processing temperature for a sealing process by using a low-melting and heat melting glass described later. The LED element 2 has a thermal expansion coefficient ($\alpha$) of 5.0 to $7.0 \times 10^{-6}/°$ C.

The p-type electrode 25 functions as a light reflecting layer to reflect a light emitted from the light emitting layer 23 in the direction of the growth substrate 20. In this embodiment, the LED element 2 has a size of 0.34 mm×0.34 mm×0.09 mm (thickness). Further, the LED element 2 has a peak wavelength of 470 nm and emits blue light.

The $Al_2O_3$ substrate 3 has a thermal expansion coefficient ($\alpha$) of $7.0 \times 10^{-6}/°$ C., and is provided with plural via holes 3A. The via holes 3A allows electrical connection between the circuit patterns 4 metalized on the front surface and the back surface of the $Al_2O_3$ substrate 3. The circuit patterns 4 include a first conductive pattern disposed on the mounting side for the LED element 2, a second conductive pattern disposed back of the mounting side, and a third conductive pattern made of tungsten (W) for electrically connecting the both sides.

The glass sealing portion 6 is made of a $B_2O_3$—$SiO_2$—$Li_2O$—$Na_2O$—$ZnO$—$Nb_2O_5$ based heat melting glass, and is formed rectangular with an upper surface 6A and side surfaces 6B on the $Al_2O_3$ substrate 3. The side surfaces 6B are formed such that a plate glass bonded to the $Al_2O_3$ substrate 3 by the hot pressing is cut together with the $Al_2O_3$ substrate 3 by a dicer. Herein, the heat melting glass is defined as a glass material produced through a melt state or softened state thereof by heat melting, and is different from a glass produced by a sol-gel method. The sol-gel glass widely changes in volume in the production process and tends to generate cracks so that it is difficult to form a thick glass film. In contrast, the heat melting glass can eliminate the problem described above. Further, the sol-gel glass tends to generate fine pores therein so that airtightness thereof may be reduced. In contrast, the heat melting glass does not cause the problem so that the LED element 2 can be sealed securely.

Generally, the heat molting glass is processed at a extremely high viscosity beyond a level regarded as a high viscosity in resins. In case of glasses, even if temperature thereof exceeds the yielding point (At) by several tens of degrees (□), viscosity thereof does not lower to the level of general sealing resins. If viscosity thereof intentionally lowers to the level of general sealing resins, the sealing and molding become difficult since temperature thereof may exceed the crystal growth temperature of the LED element 2, or flowing of softened glass may occur although the glass may not be adhered to the mold. Therefore, it is preferred that the hot pressing is conducted at a viscosity not less than $10^4$ poise.

Method for Making LED 1

A method for making the LED 1 will be explained below. First, the $Al_2O_3$ substrate 3 with the via holes 3A is provided, and W-paste is screen-printed on the surface of the $Al_2O_3$ substrate 3 according to the circuit pattern.

Then, the $Al_2O_3$ substrate 3 integrated with the heat melting glass is placed on a dicer, where the ceramic substrate 3 is diced to separate the LED elements 2 from each other, so that each of the LED devices 1 can be completed.

Composition of the Lass Sealing Portion 6

The heat melting glass used in this embodiment will be explained in detail below. Samples 1 to 15 are prepared that each has a composition ratio as shown in Table 1 and composed selectively of $B_2O_3$, $SiO_2$, $Li_2O$, $Na_2O$, ZnO, $Nb_2O_5$, $TiO_2$ and $ZrO_2$ as components constituting the glass sealing portion 6.

Method for preparing Samples 1 to 15 will be explained below.

Oxides, hydroxides, carbonates, nitrates etc. corresponding to the above components are used as a raw material. The raw materials are weighed such that each of Samples 1 to 15 becomes 100 g after the vitrification, sufficiently mixed, and entered into a platinum crucible. Then, the raw materials are melted at a temperature of 1150° C. to 1350° C. in an electrical furnace for several hours, homogenized by stirring, clarified, poured into a mold, and slowly annealed to have the glass materials (=Samples 1 to 15). The glass materials thus obtained are used for the measurement of properties etc as shown in Table 1.

TABLE 1

| Composition | Sample 1 | Sample 2 | Sample 3 | Sample 4 | Sample 5 | Sample 6 | Sample 7 | Sample 8 | Sample 9 | Sample 10 | Sample 11 | Sample 12 | Sample 13 | Sample 14 | Sample 15 |
|---|---|---|---|---|---|---|---|---|---|---|---|---|---|---|---|
| $B_2O_3$ | 25 | 23 | 23 | 23 | 23 | 21 | 24 | 23 | 23 | 23 | 23 | 21 | 21 | 21 | 23 |
| $SiO_2$ | 10 | 13 | 13 | 13 | 13 | 15 | 12 | 13 | 13 | 13 | 13 | 13 | 13 | 13 | 13 |
| $Li_2O$ | 2 | 1 | 2 | 2 | 2 | 2 | 2 | 2 | 2 | 1.5 | 1.5 | 1.5 | 1.5 | 1 | |
| $Na_2O$ | 3 | 4 | 3 | 3 | 3 | 3 | 3 | 3 | 3 | 2.5 | 2.5 | 2.5 | 2 | 2 | 4 |
| ZnO | 45 | 51 | 45 | 44 | 46 | 46 | 47 | 46 | 47 | 49 | 49.5 | 50 | 50.5 | 51 | 48 |
| $Nb_2O_5$ | 10 | 8 | 14 | 15 | 13 | 13 | 12 | 12 | 11 | 12 | 11.5 | 12 | 12 | 12 | 12 |
| $TiO_2$ | 4 | | | | | | | | | | | | | | |
| $ZrO_2$ | | | | | | | | 1 | 1 | | | | | | |
| Total | 100 | 100 | 100 | 100 | 100 | 100 | 100 | 100 | 100 | 100 | 100 | 100 | 100 | 100 | 100 |
| Stability | B | B | A | B | A | A | A | A | A | A | A | A | A | A | A |
| Weather resistance | B | B | B | B | B | B | B | B | B | A | A | A | A | A | A |
| nd | — | 1.68 | 1.7 | 1.7 | 1.7 | 1.7 | 1.68 | 1.7 | 1.68 | 1.7 | 1.69 | 1.7 | 1.71 | 1.71 | 1.69 |
| Tg | 467 | 482 | 474 | 475 | 475 | 476 | 474 | 473 | 472 | 487 | 485 | 482 | 487 | 458 | 508 |
| At | 505 | 517 | 499 | 512 | 510 | 511 | 511 | 512 | 500 | 528 | 529 | 519 | 525 | 534 | 546 |
| α | 69 | 68 | 72 | 72 | 69 | 68 | 69 | 69 | 70 | 64 | 65 | 65 | 64 | 58 | 67 |

Then, the $Al_2O_3$ substrate 3 with the W-paste screen-printed thereon is heated at about 1000° C. so as to burn the W into the substrate 3, and Ni and Au are plated on the W to form the circuit pattern 4.

Then, the plural LED elements 2 are electrically connected to the circuit pattern 4 (on the front surface side) of the $Al_2O_3$ substrate 3 by the Au stud bumps 5. In this case, two bump connections in total (each for the anode and cathode) are conducted.

Then, the plate-shaped $B_2O_3$—$SiO_2$—$Li_2O$—$Na_2O$—ZnO—$Nb_2O_5$ based heat melting glass is set parallel to the $Al_2O_3$ substrate 3 mounting the LED elements 2 thereon, and the hot pressing is conducted in nitrogen atmosphere. Thus, the heat melting glass is bonded to the $Al_2O_3$ substrate 3 through oxides contained therein. It is preferable that the heat melting glass has a viscosity of $10^5$ to $10^7$ poise during the hot pressing. This viscosity range prevents the glass material from adhering to the upper mold and flowing out due to the lower viscosity to increase the yield. Also, the viscosity range prevents the glass material from lacking in bonding strength to the $Al_2O_3$ substrate 3 and prevents the Au stud bump 5 from being crashed due to the higher viscosity.

In Table 1, with regard to stability, a sample with good stability is evaluated as "B", and a sample with extremely good stability is evaluated as "A". Method for evaluating the stability will be explained below. First, the crucible is taken out at 1250° C., cooled at a constant cooling speed and stirred by a platinum stirrer. The stirring is conducted for about 3 minutes, and the condition of the glass material in the crucible is observed. The stirred melts of Samples 1 to 15 are not subjected to loss of transparency, and are nearly transparent and all good in stability. In the evaluation, a sample with a little white turbidity observed is evaluated as "B", and a sample without a grain of white turbidity is evaluated as "A".

With regard to weather resistance, a sample with good weather resistance is evaluated as "B", and a sample with extremely good weather resistance is evaluated as "A". The weather resistance is evaluated based on whether a white turbidity due to a chemical reactant is observed on the surface of the sample or not after conducting the weather resistance test under 85° C., Rh 85%, and 2000 hours. The white turbidity is not observed on the surface of Samples 1 to 15, so that they have good weather resistance. In the evaluation, a sample with a little white turbidity observed on the surface thereof at a microscopic area by a microscope is evaluated as "B", and a sample without a grain of white turbidity is evaluated as "A".

As shown in Table 1, Sample 1 has a composition of $B_2O_3$ (25 wt %), $SiO_2$ (10 wt %), $Li_2O$ (2 wt %), $Na_2O$ (3 wt %), ZnO (46 wt %), $Nb_2O_5$ (10 wt %) and $TiO_2$ (4 wt %). Sample 1 has a glass transition temperature (Tg) of 467° C., a yielding point (At) of 505° C. and a thermal expansion coefficient ($\alpha$) of $6.9\times10^{-6}/°$ C. Herein, the thermal expansion coefficient ($\alpha$) is taken in the range of 100° C. to 300° C.

Sample 2 has a composition ratio of $B_2O_3$ (23 wt %), $SiO_2$ (13 wt %), $Li_2O$ (1 wt %), $Na_2O$ (4 wt %), ZnO (51 wt %) and $Nb_2O_5$ (8 wt %). Sample 2 has a glass transition temperature (Tg) of 482° C., a yielding point (At) of 517° C., a thermal expansion coefficient ($\alpha$) of $6.8\times10^{-6}/°$ C., and a refractive index (nd) of 1.68.

Sample 3 has a composition ratio of $B_2O_3$ (23 wt %), $SiO_2$ (13 wt %), $Li_2O$ (2 wt %), $Na_2O$ (3 wt %), ZnO (45 wt %) and $Nb_2O_5$ (14 wt %). Sample 3 has a glass transition temperature (Tg) of 474° C., a yielding point (At) of 499° C., a thermal expansion coefficient ($\alpha$) of $7.2\times10^{-6}/°$ C., and a refractive index (nd) of 1.70.

Sample 4 has a composition ratio of $B_2O_3$ (23 wt %), $SiO_2$ (13 wt %), $Li_2O$ (2 wt %), $Na_2O$ (3 wt %), ZnO (44 wt %), $Nb_2O_5$ (15 wt %). Sample 4 has a glass transition temperature (Tg) of 475° C., a yielding point (At) 512° C., a thermal expansion coefficient ($\alpha$) of $7.2\times10^{-6}/°$ C., and a refractive index (nd) of 1.70.

Sample 5 has a composition ratio of $B_2O_3$ (23 wt %), $SiO_2$ (13 wt %), $Li_2O$ (2 wt %), $Na_2O$ (3 wt %), ZnO (46 wt %) and $Nb_2O_5$ (13 wt %). Sample 5 has a glass transition temperature (Tg) of 475° C., a yielding point (At) of 510° C., a thermal expansion coefficient ($\alpha$) of $6.9\times10^{-6}/°$ C., and a refractive index (nd) of 1.70

Sample 6 has a composition ratio of $B_2O_3$ (21 wt %), $SiO_2$ (15 wt %), $Li_2O$ (2 wt %), $Na_2O$ (3 wt %), ZnO (46 wt %) and $Nb_2O_5$ (13 wt %). Sample 6 has a glass transition temperature (Tg) of 476° C., a yielding point (At) of 511° C., a thermal expansion coefficient ($\alpha$) of $6.8\times10^{-6}/°$ C., and a refractive index (nd) of 1.70.

Sample 7 has a composition ratio of $B_2O_3$ (24 wt %), $SiO_2$ (12 wt %), $Li_2O$ (2 wt %), $Na_2O$ (3 wt %), ZnO (47 wt %), $Nb_2O_5$ (12 wt %). Sample 7 has a glass transition temperature (Tg) of 474° C., a yielding point (At) of 511° C., a thermal expansion coefficient ($\alpha$) of $6.9\times10^{-6}/°$ C., and a refractive index (nd) of 1.69.

Sample 8 has a composition ratio of $B_2O_3$ (23 wt %), $SiO_2$ (13 wt %), $Li_2O$ (2 wt %), $Na_2O$ (3 wt %), ZnO (46 wt %), $Nb_2O$, (12 wt %) and $ZrO_2$ (1 wt %). Sample 8 has a glass transition temperature (Tg) of 473° C., a yielding point (At) of 512° C., a thermal expansion coefficient ($\alpha$) of $6.9\times10^{-6}/°$ C., and a refractive index (nd) of 1.70.

Sample 9 has a composition ratio of $B_2O_3$ (23 wt %), $SiO_2$ (13 wt %), $Li_2O$ (2 wt %), $Na_2O$ (3 wt %), ZnO (47 wt %), $Nb_2O_5$ (11 wt %) and $ZrO_2$ (1 wt %). Sample 9 has a glass transition temperature (Tg) of 472° C., a yielding point (At) of 500° C., a thermal expansion coefficient (a) of $7.0\times10^{-6}/°$ C., and a refractive index (nd) of 1.69.

Sample 10 has a composition ratio of $B_2O_3$ (23 wt %), $SiO_2$ (13 wt %), $Li_2O$ (1.5 wt %), $Na_2O$ (2.5 wt %), ZnO (48 wt %) and $Nb_2O_5$ (12 wt %). Sample 10 has a glass transition temperature (Tg) of 487° C., a yielding point (At) of 528° C., a thermal expansion coefficient ($\alpha$) of $6.4\times10^{-6}/°$ C., and a refractive index (nd) of 1.70.

Sample 11 has a composition ratio of $B_2O_3$ (23 wt %), $SiO_2$ (13 wt %), $Li_2O$ (1.5 wt %), $Na_2O$ (2.5 wt %), ZnO (48.5 wt %) and $Nb_2O_5$ (11.5 wt %). Sample 11 has a glass transition temperature (Tg) of 485° C., a yielding point (At) of 529° C., a thermal expansion coefficient ($\alpha$) of $6.5\times10^{-6}/°$ C., and a refractive index (nd) of 1.69.

Sample 12 has a composition ratio of $B_2O_3$ (21 wt %), $SiO_2$ (13 wt %), $Li_2O$ (1.5 wt %), $Na_2O$ (2.5 wt %), ZnO (50 wt %) and $Nb_2O_5$ (12 wt %). Sample 12 has a glass transition temperature (Tg) of 482° C., a yielding point (At) of 519° C., a thermal expansion coefficient ($\alpha$) of $6.6\times10^{-6}/°$ C., and a refractive index (nd) of 1.70.

Two samples different in thickness are prepared by using Sample 12, and the spectral transmittance of each sample is measured. The spectral transmittance depends upon light reflection on the surface of the samples and light absorption inside the samples. Although the two samples are designed to be 035 mm and 0.70 mm, respectively, in thickness, they are 0.360 mm and 0.709 mm, respectively, in actual measurement (See FIG. 2).

FIG. 2 is a graph showing a relationship between the wavelength and the spectral transmittance the two samples prepared from Sample 12. As shown in FIG. 2, the two samples prepared from Sample 12 have, in the form of a plate with a thickness of 0.360 mm and 0.709 mm, respectively, a spectral transmittance of not less than 85% in the range of 350 nm to 800 nm. In comparing the two samples, the difference in thickness is 0.349 mm, but the spectral transmittance of them mostly agrees to each other in the range of 350 nm to 800 nm. In other words, Sample 12 has an internal transmittance of not less than 95% in the form of a plate with a thickness of about 0.709 mm, which means that Sample 12 has an internal transmittance of not less than 90% in the form of a plate with a thickness of 1 mm. Meanwhile, "internal transmittance" means a transmittance inside a sample obtained by removing the influence of surface reflection, and can be obtained by subtracting a surface-reflection loss from a spectral transmittance.

Sample 13 has a composition ratio of $B_2O_3$ (21 wt %), $SiO_2$ (13 wt %), $Li_2O$ (1.5 wt %), $Na_2O$ (2 wt %), ZnO (50.5 wt %) and $Nb_2O_5$ (12 wt %). Sample 13 has a glass transition temperature (Tg) of 487° C., a yielding point (At) of 525° C., a thermal expansion coefficient ($\alpha$) of $6.4\times10^{-6}/°$ C., and a refractive index (nd) of 1.71.

Sample 14 has a composition ratio of $B_2O_3$ (21 wt %), $SiO_2$ (13 wt %), $Li_2O$ (1 wt %), $Na_2O$ (2 wt %), ZnO (51 wt %) and $Nb_2O_5$ (12 wt %). Sample 14 has a glass transition temperature (Tg) of 498° C., a yielding point (At) of 534° C., a thermal expansion coefficient ($\alpha$) of $5.8\times10^{-6}/°$ C., and a refractive index (nd) of 1.71.

Sample 15 has a composition ratio of $B_2O_3$ (23 wt %), $SiO_2$ (13 wt %), $Li_2O$ (0 wt %), $Na_2O$ (4 wt %), ZnO (48 wt %) and $Nb_2O_5$ (12 wt %). Sample 15 has a glass transition temperature (Tg) of 508° C., a yielding point (At) of 546° C., a thermal expansion coefficient ($\alpha$) of $6.1\times10^{-6}/°$ C., and a refractive index (nd) of 1.69.

As described above, it is confirmed that Samples 1 to 15 has a stale bonding strength to the $Al_2O_3$ substrate 3 without the peeling and cracks. All of Samples 1 to 15 are transparent or only a little changed in transparency even when loss of clarity occurs therein, so that they have good stability (evaluated as B or A in Table 1). In addition, as the result of the weather resistance test of 85° C., Rh 85% and 2000 hours, Samples 1 to 15 are observed almost no white turbidity on the surface thereof, so that they have a good weather resistance (evaluated as "B" or "A" in Table 1).

Especially, of Samples 1 to 15, Samples 3 and 5 to 15 have the extremely good stability (evaluated as "A" in Table 1).

Also, Samples 10 to 15 have the extremely good weather resistance (evaluated as "A" in Table 1).

Generally, alkali oxides are a compound that has an extremely large effect on improving the solubility in glass production and lowers the softening temperature of glass. However, when the content of the alkali oxides exceeds a certain degree, it may lower the weather resistance drastically. Of $Na_2O$, $Li_2O$ and $K_2O$ as the alkali oxides, $Li_2O$ is a compound that has a large effect on lowering the softening temperature of glass and has the smallest impact on the weather resistance. Of them, $K_2O$ lowers most drastically the weather resistance. $Na_2O$ has an intermediate property between $Li_2O$ and $K_2O$.

In the $B_2O_3$—$SiO_2$—$Li_2O$—$Na_2O$—$ZnO$—$Nb_2O_5$ based heat melting glass, if intended to satisfy the thermal property by only $Na_2O$, the content of $Na_2O$ in the glass may be too large so that it is impossible to obtain a glass with an extremely good weather resistance as described above. If intended to obtain a glass with an extremely good weather resistance, a glass without the thermal property suitable for the sealing may be produced as shown in Sample 15. With regard to the thermal property suitable for the sealing such as (Tg) and (At), the glass transition temperature (Tg) is preferably not more than 500° C., more preferably not more than 490° C., and the yielding point (At) is preferably not more than 540° C., more preferably not more than 530° C. Thus, as shown in Samples 10 to 14, by replacing a given part of $Na_2O$ with $Li_2O$, the glass can satisfy the good thermal property suitable for the sealing as well as the extremely good weather resistance (evaluated as "A" in Table 1).

Sample 13-2 with $B_2O_3$ included in the $B_2O_3$—$SiO_2$—$Li_2O$—$Na_2O$—$ZnO$—$Nb_2O_5$ based heat melting glass is produced and measured the properties etc. Meanwhile, Sample 13-2 has the same composition as Sample 13 except the content of ZnO and $Bi_2O_3$. In other words, Sample 13-2 has the composition that a part of ZnO of Sample 13 is substituted by $Bi_2O_3$.

TABLE 2

| Composition | Sample 13 | Sample 13-2 |
| --- | --- | --- |
| $B_2O_3$ | 21 | 21 |
| $SiO_2$ | 13 | 13 |
| $Li_2O$ | 1.5 | 1.5 |
| $Na_2O$ | 2 | 2 |
| ZnO | 50.5 | 40.5 |
| $Nb_2O_5$ | 12 | 12 |
| $Bi_2O_3$ | — | 10 |
| Total | 100 | 100 |
| nd | 1.71 | 1.73 |
| Tg | 487 | 484 |
| At | 525 | 526 |
| α | 64 | 66 |

As shown in Table 2, Sample 13-2 has a composition of $B_2O_3$ (21 wt %), $SiO_2$ (13 wt %), $Li_2O$ (1.5 wt %), $Na_2O$ (2 wt %), ZnO (40.5 wt %), $Nb_2O_5$ (12 wt %) and $Bi_2O_3$ (10 wt %). Sample 13-2 has a glass transition temperature (Tg) of 484° C., a yielding point (At) of 526° C. and a thermal expansion coefficient (α) of $6.6 \times 10^{-6}$/° C., and a refractive index (nd) of 1.73. As a result, by replacing a part of ZnO with $Bi_2O_3$, the glass transition temperature (Tg) can be reduced not more than 490° C. and the yielding point (At) can be reduced not less than 530° C., and simultaneously the refractive index (nd) can be enhanced.

Advantages of the First Embodiment

According to the first preferred embodiment described above, the following advantages can be obtained.

(1) A glass sealing portion 6 with a good weather resistance as well as a good stability can be realized. Therefore, even when the LED 1 is used under harsh environment etc. for long hours, the glass sealing portion 6 can be prevented from deteriorating, and temporal decrease in light extraction efficiency can be also prevented effectively.

(2) The glass sealing portion 6 has a high refractive index and a high transmittance characteristic as well as a good stability, so that a high reliability and a high light emission efficiency can be simultaneously obtained. If the LED element 2 with a high refractive index is sealed with a material with a low refractive index, light generated in the LED element 2 may not be emitted outward from the interior of the LED element 2 and may be internally absorbed. As the refractive index of the sealing material increases, light extraction efficiency from the interior of the LED element 2 increases. Generally, there is a tendency that as the refractive index of the sealing material increases, transmittance at a wavelength of particularly less than 500 nm deteriorates in initial characterization or temporal change characterization. Thus, the light extraction efficiency of the sealing material deteriorates. So far, epoxy resin with a refractive index (nd) of 1.55 is often used as the sealing material for the blue LED element 2, but decrease in transmittance was remarkable due to the increase in spontaneous light and heat of the LED element 2 along with the increased light output thereof. Therefore, at present, methyl based silicone resins with a refractive index (nd) of 1.4 are often used, although they have light extraction efficiency lower by about 20% than epoxy resin, since they are stable to the spontaneous light and heat.

In this embodiment, the sealing material is made of heat melting glass, so that high reliability and high light extraction efficiency can be simultaneously obtained.

As shown in FIG. 2, the glass of this embodiment has an internal transmittance not less than 90% (per 1 mm thickness) at 350 nm to 800 mm, so that it can be adapted to use not only in the visible region but also the ultraviolet region near mercury (Hg) spectrum at 365 nm where the resin material deteriorates drastically. With respect to the GaN based LED element 2 on a sapphire substrate (nd=1.76-1.77), light extraction efficiency in sealing by glass with a refractive index (nd) of 1.7 is similar to that by epoxy resin with a refractive index (nd) of 1.55. However, with respect to the GaN based LED element on a substrate with a refractive index (nd) not less than 1.8 such as a $Ga_2O_3$ substrate, a GaN substrate and a SiC substrate, light emission efficiency in sealing by glass with a refractive index (nd) not less than 1-6 can be improved as compared to conventional resins (with a refractive index (nd)<1.6).

(3) Since the $B_2O_3$—$SiO_2$—$Li_2O$—$Na_2O$—$ZnO$—$Nb_2O_5$ based heat melting glass is used for the glass sealing portion 6 and the hot pressing is performed in a high viscosity condition, the processing can be conducted at a sufficiently lower temperature than the crystal growth temperature.

(4) The $Al_2O_3$ substrate 3 and the glass sealing portion 6 are bonded based on the chemical bonding through the oxides, so that strong sealing strength can be obtained. Therefore, a small package with a small bonding area can be also realized.

(5) The $Al_2O_3$ substrate 3 and the glass sealing portion 6 have substantially the same thermal expansion coefficient, so that a bonding failure such as peeling and crack is difficult to cause even when brought to room temperature or low temperature after bonding at high temperature.

In addition, since glass materials hardly generate cracks by compression stress although easily generate cracks by tensile stress, the glass sealing portion 6 is set to have a thermal expansion coefficient a bit lower than the $Al_2O_3$ substrate 3.

In general, the glass material has a property that the thermal expansion coefficient thereof increases at a higher temperature than the Tg (glass transition) point. Thus, when the glass sealing is conducted at a higher temperature than the Tg point, it is preferable to consider the thermal expansion coefficient not only at temperature lower than the Tg point but also at temperature higher than the Tg point in order to achieve the stable glass sealing. In other words, the glass material constituting the glass sealing portion 6 needs to have a thermal expansion coefficient similar to that of the $Al_2O_3$ substrate 3 in consideration of the thermal expansion coefficient including that at higher temperature than the Tg point as described above. Thereby, internal stress to cause a warpage in the $Al_2O_3$ substrate 3 can be reduced, and shear failure can be prevented from occurring in the glass even when the bonding between the $Al_2O_3$ substrate 3 and the glass sealing portion 6 can be secured.

Thus, by expanding the size of the $Al_2O_3$ substrate 3 and the glass sealing portion 6, the quantity of devices to be produced together can be increased. The inventors confirm that no peeling or cracks does not occur even in 1000 cycles of liquid-phase thermal shock test (−40° C. to 100° C.). Further, when a bonding base test for glass materials with a size of 5 mm×5 mm to ceramic substrates is conducted, where the glass materials and the ceramic substrates with various thermal expansion coefficients are combined, it is confirmed that the bonding can be achieved without causing cracks if one material with lower thermal expansion coefficient has a ratio in thermal expansion coefficient of 0.85 or more to the other material with higher thermal expansion coefficient. "to have a similar thermal expansion coefficient" means the above ratio range, although it depends on stiffness, size etc. of the materials.

For example, when the $Al_2O_3$ substrate 3 has a thermal expansion coefficient of $7.0\times10^{-6}$/° C., the glass sealing portion 6 has preferably a thermal expansion coefficient not less than $5.95\times10^{-6}$M. Samples 10 to 13 have a thermal expansion coefficient not less than $5.95\times10^{-6}$/° C. as well as extremely good transparency stability and weather resistance (evaluated as "A" in Table 1). Therefore, if the sum content of $Li_2O$ and $Na_2O$ in the heat melting glass is 3.5 wt % to 4 wt % (See Samples 10 to 13 in Table 1), the glass sealing portion 6 can have a suitable thermal expansion coefficient (i.e., a similar thermal expansion coefficient to the substrate 3) as well as the extremely good transparency stability and weather resistance.

(6) Since the LED elements 2 are flip-chip mounted and no wires are needed, no failure in electrodes occurs even when conducting the sealing process at a high viscosity. That is, the viscosity of the heat melting glass during the sealing process is as high as $10^4$ to $10^8$ poise and the properties thereof are extremely different than the epoxy resins which are in liquid form and has only a viscosity of about 5 poise before the thermal hardening. Therefore, if a face-up type LED element is used where an electrode on the surface of the element is connected to a power supplying member such as a lead by wire, crash or deformation of the wire may occur during the glass sealing process, but this can be prevented by using the flip-chip mounting. Further, if a flip-chip type LED element is used where an electrode on the surface of the element is flip-chip mounted on a power supplying member such as a lead through an Au bump etc., crash of the bump or short circuit between the bumps may occur due to pressure applied in the direction of the power supplying member to the LED element 2 based on the viscosity of the glass, but this can be also prevented.

Conventionally, bump bonding is often conducted at three points or more in consideration of heat stress after the sealing process. However, in this embodiment, since the $Al_2O_3$ substrate 3, the glass sealing portion 6 and the LED element 2 have similar thermal expansion coefficient to each other, the mounting the LED element 2 can be balanced even in thermal stress after the sealing process and sufficient reliability can be secured even when the bump bonding is conducted at two points. Therefore, the pad electrode of the p-type electrode 25 below which the light emitting layer 23 is located only has to have an area as needed for one point bump, where light absorption by the pad electrode can be reduced. Thus, it is optically advantageous, and the light extraction efficiency can be enhanced.

(7) The plate heat melting glass is set parallel to the $Al_2O_3$ substrate 3 and the hot pressing is conducted at high viscosity, where the heat melting glass is pressed parallel to the surface of the $A_2O_3$ substrate 3 and planar-bonded thereto. Therefore, no voids occur when sealing the GaN based LED element 2.

(8) The circuit pattern 4 for wiring the $Al_2O_3$ substrate 3 is drawn to the back surface through the via hole 3A. Therefore, the production process can be simplified without requiring special countermeasures against the problems that the glass material penetrates into unnecessary sites and that the electrical terminal is covered with the glass material. Further, since plural devices are simultaneously sealed by the plate heat melting glass, the plural LEDs 1 can be easily mass-produced by dicing. Meanwhile, since the heat melting glass is processed at high viscosity, the mass-production can be sufficiently achieved if only the external terminals are drawn to the back surface even without using the via holes, where the countermeasures required for the resin sealing are not necessary.

(9) The LED elements 2 are flip-chip mounted, so that the ultra-small LED 1 such as 0.5 mm square can be realized while solving the problems in conducting the glass sealing process. This is because the boding space for wires is not needed and no peeling at the interface occurs even at a small bonding space since the glass sealing portion 6 and the $Al_2O_3$ substrate 3 have similar thermal expansion coefficients and are securely bonded based on chemical bonding.

(10) The LED element 2 and the glass sealing portion 6 have similar thermal expansion coefficients. Thus, since all the adjacent members including the $Al_2O_3$ substrate 3 have similar thermal expansion coefficients, the internal stress caused can be very low even in the temperature difference between high temperature during the glass sealing process and room temperature, so that stable workability can be obtained without generating cracks. Further, the internal stress can be thus reduced to enhance the impact resistance, so that the glass sealing type LED with high reliability can be obtained.

(11) The $Al_2O_3$ substrate 3 is used as an alumina substrate, so that the parts cost can be reduced, and the reduction in device cost can be realized as well as the mass productivity since it is readily available. Further, $Al_2O_3$ has a good thermal conductivity, so that it can be sufficiently adapted to high brightness or high output type devices. Furthermore, since the $Al_2O_3$ substrate 3 has a small light absorption, it is optically advantageous.

Modifications

The heat melting glass can include $ZrO_2$ and $TiO_2$ as optional components. In this case, it is preferable that it includes 0 to 3 wt % of $ZrO_2$ and 0 to 5 wt % of $TiO_2$.

As described earlier, Samples 10 to 14 have an extremely good stability and weather resistance (evaluated as "A" in Table 1), and thermal properties such as (Tg) and (At) suitable for the sealing process. That is, when the heat melting glass is composed of $B_2O_3$ (21 to 23 wt %), $SiO_2$ (11 to 13 wt %), $Li_2O$ (1 to 1.5 wt %), and $Na_2O$ (2 to 2.5 wt %), it can have the extremely good weather resistance.

In this case, when the heat melting glass is further composed of ZnO (48 to 51 wt %) and $Nb_2O_5$ (11.5 to 12 wt %), it can also have the extremely good stability and the thermal properties suitable for the glass sealing portion 6 such as a yielding point (At) not more than 540° and a thermal expansion coefficient ($\alpha$) not more than $7.0\times10^{-6}/°$ C. Further, the sum content of ZnO and $Bi_2O_3$ are preferably 48 wt % to 51 wt %, since Sample 13-2 in which a part of ZnO in Sample 13 is substituted by $Bi_2O_3$ has the extremely good stability, a yielding point (At) not more than 540° C. and a thermal expansion coefficient ($\alpha$) not more than $7.0\times10^{-6}/°$ C.

In addition, it is preferable from the viewpoint of thermal properties that the sum content of $Li_2O$ and $Na_2O$ is 3.5 wt % to 4 wt % in the above range of ZnO and $Nb_2O_5$, since Samples 10 to 13 have a lower glass transition temperature (Tg) and yielding point (At) than Sample 14. Further, the sum content of $Li_2O$ and $Na_2O$ is preferably 3.5 wt % to 4 wt %, where the sum content of ZnO and $Bi_2O_3$ is 48 wt % to 51 wt % and $Nb_2O_5$ is 11.5 wt % to 12 wt %, since Sample 13-2 in which a part of ZnO in Sample 13 is substituted by $Bi_2O_3$ has a lower glass transition temperature (Tg) and yielding point (At) than Sample 14.

Although in the first embodiment, the LED 1 uses the LED element 2 made of a GaN based semiconductor material, the LED element is not limited to the GaN based LED element 2, and may be made of another semiconductor material.

The LED element 2 may be produced by scribing. In this case, the LED element 2 produced by scribing may have on a side surface thereof, as a cut section, a sharpened concave and convexity, and the side surface of the LED element 2 is preferably coated by an element coating material. The element coating material includes $SiO_2$ based coating material with optical transparency. The element coating material can prevent the occurrence of cracks and voids in case of overmolding etc.

In the first embodiment, the circuit pattern 4 is formed such that the W-paste is screen-printed on the surface of the $Al_2O_3$ substrate 3, heated, and the Ni plating and Au plating are formed thereon. Alternatively, the circuit pattern 4 may be formed such that Ti, Cr etc. is deposited on the surface of the $Al_2O_3$ substrate 3, and the Ni plating and Au plating are formed thereon, or such that Cu is deposited on the surface of the $Al_2O_3$ substrate 3 by plating, and the Ni plating and Au plating are formed thereon.

The glass sealing portion 6 may deteriorate when dew condensation generates although no deterioration occurs in the high temperature humidity resistance test as described earlier. Even in this case, the glass sealing portion 6 can be prevented from deteriorating due to the dew condensation at high temperature by coating a silicone resin etc. on the surface of the glass sealing portion 6. The coating material coated on the surface of the glass sealing portion 6 preferably includes an inorganic material such as a $SiO_2$ based material and $Al_2O_3$ based material which has not only humidity resistance but also acid resistance and alkali resistance.

The LED 1 can be formed as a wavelength conversion type by adding a phosphor to the $B_2O_3$—$SiO_2$—$Li_2O$—$Na_2O$—ZnO—$Nb_2O_5$ based heat melting glass of the first embodiment, where the wavelength conversion is conducted such that a fluorescent light generated excited by light from the GaN based LED element 2 is mixed with the light from the GaN based LED element 2. In this case, the phosphor containing glass may be prepared such that the heat melting glass is crushed to particles with an average particle diameter of about 10 to 100 μm, the crushed heat melting glass is mixed with YAG (Yttrium Aluminum Garnet) phosphor particles with an average particle diameter of about 10 μm, and they are melted again. When the phosphor containing glass material is used for the glass sealing portion 6, the phosphor can be uniformly dispersed in the glass sealing portion 6 even if the glass material has a relatively high viscosity.

The solid state device may be composed by using an LED element with a peak wavelength of 390 nm, blue phosphor, green phosphor, and red phosphor to emit white light stable in chromaticity. Alternatively, the solid state device may be composed by using a single phosphor to emit an arbitrary emission light other than white light. Even when the LED element with a short wavelength 400 nm or less is used, the $B_2O_3$—$SiO_2$—$Li_2O$—$Na_2O$—ZnO—$Nb_2O_5$ based heat melting glass as the sealing material does not deteriorate. Alternatively, a thin phosphor layer can be formed on the surface of the glass sealing portion 6. In the phosphor layer, a binder to bind the phosphor can be optionally selected, for example a silicone resin or a sol-gel glass can be used. The phosphor layer using the silicone resin as a binder can be formed by, e.g., coating the silicone resin including the phosphor on the surface of the glass sealing portion 6, and hardening the silicone resin. The phosphor layer using the sol-gel glass as a binder can be formed by, e.g., coating metallic alkoxide including the phosphor on the surface of the glass sealing portion 6, and hydrolyzing the metallic alkoxide.

The $B_2O_3$—$SiO_2$—$Li_2O$—$Na_2O$—ZnO—$Nb_2O_5$ based heat melting glass may include $Bi_2O_3$ to have a higher refractive index. In case of using such a heat melting glass, it is preferred that an LED element is composed of a substrate with a refractive index (nd) not less than 1.8 so as to increase the light extraction efficiency from the LED element. For example, the LED element with a substrate with a refractive index (nd) not less than 1.8 can be composed by forming a GaN based semiconductor on any of a $Ga_2O_3$ substrate, a GaN substrate, a SiC substrate etc.

The $B_2O_3$—$SiO_2$—$Li_2O$—$Na_2O$—ZnO—$Nb_2O_5$ based heat melting glass can be used as a sealing material in an LED light source using an LED element with a peak emission wavelength of 370 nm, as an alternative to a conventional mercury lamp as a light source for hardening UV curable resin. Conventionally, in order to prevent the deterioration of the sealing material of the LED element, a bare LED element is mounted on a stem and sealed by hermetic seal to ensure the airtightness. Due to this, the solid state device grows in size and the production cost is increased. In contrast, by using the $B_2O_3$—$SiO_2$—$Li_2O$—$Na_2O$—ZnO—$Nb_2O_5$ based heat melting glass for sealing the LED element, the solid state device can be downsized to reduce the production cost while enhancing the light extraction efficiency from the LED element so as to realize a high output device.

Figure 3B:
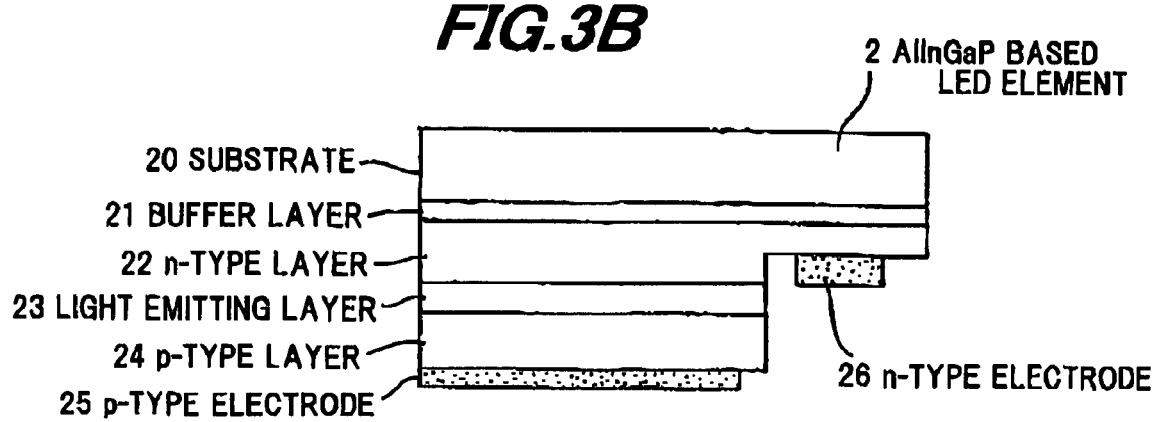
FIG. 3B is a side view showing an LED element in FIG. 3A.

Although in the first embodiment, the solid state device uses the GaN based LED element 2, the other LED element 2, e.g., one as shown in FIGS. 3A and 3B, can be also used. FIG. 3A is a longitudinal cross sectional view showing the LED, and FIG. 3B is a side view showing an AlInGaP based LED element as a light source for the LED.

As shown in FIG. 3A, the LED 1 is composed of the LED element 2 formed of an AlInGaP based semiconductor material, and as shown in FIG. 3B, the AlInGaP based semiconductor material is bonded to a substrate (a GaP substrate) 20 by thermal compression. The glass sealing portion 6 is made of the same $B_2O_3$—$SiO_2$—$Li_2O$—$Na_2O$—ZnO—$Nb_2O_5$ based heat melting glass as used in the first embodiment. In each drawing and explanation below, components identical or equivalent to the components used in the first embodiment are indicated by the same numerals.

The LED 1 is, as shown in FIG. 3A, composed of the GaP substrate 20 with a relatively high refractive index (n=3.5), the LED element 2 formed of the AlInGaP based semiconductor material and having a refractive index (n=3.0 to 3.6) near the substrate 20, and the glass sealing portion 6 formed of the $B_2O_3$—$SiO_2$—$Li_2O$—$Na_2O$—$ZnO$—$Nb_2O_5$ based heat melting glass for sealing the LED element 2. Thus, it can have increased light extraction efficiency, and good heat radiation property and mounting performance. Further, since it is sealed by the glass with a higher refractive index than the epoxy based resin and silicone based resin, the aperture angle can be increased by 30 to 40% in solid angle to enhance the light extraction efficiency form the LED element 2. The substrate 20 may be formed of GaP.

Composition of Light Emitting Device 100 Using LED 1

Figure 4:
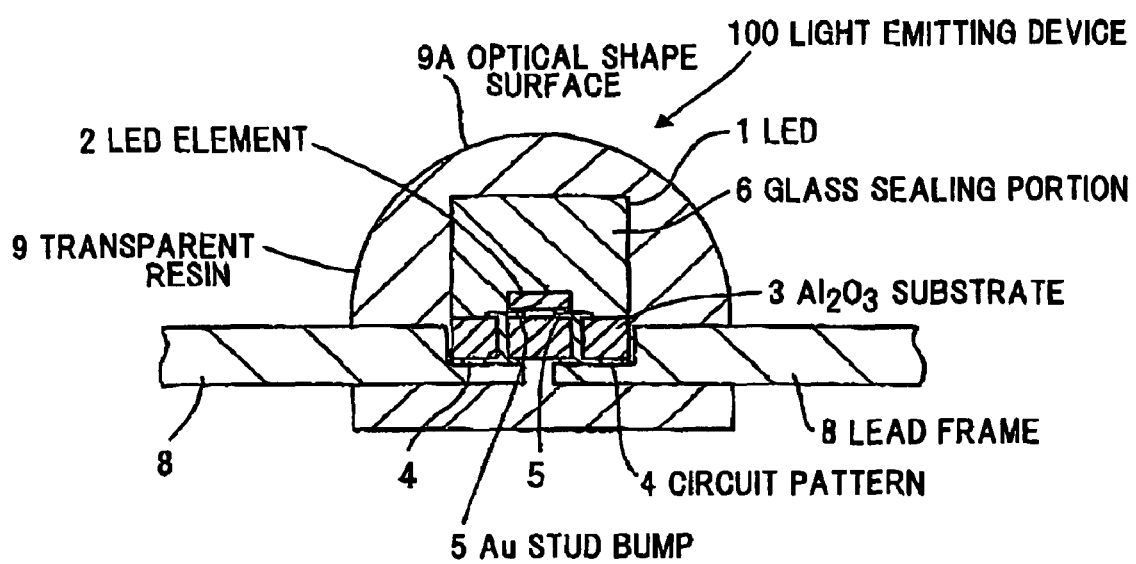
FIG. 4 is a longitudinal cross sectional view showing a light emitting device using an LED in the first preferred embodiment according to the invention.

FIG. 4 is a longitudinal cross sectional view showing a light emitting device 100 using the LED of the first embodiment. The light emitting device 100 is composed such that the LED 1 of the first embodiment is bonded to a lead frame 8, and the entire device is covered with a transparent resin 9 formed of a transparent acrylic resin. As described earlier, the LED 1 is formed by sealing the GaN based LED element 2 with the glass sealing portion 6 made of the $B_2O_3$—$SiO_2$—$Li_2O$—$Na_2O$—$ZnO$—$Nb_2O_5$ based heat melting glass.

The transparent resin 9 has a hemispherical optical shape surface 9A with the origin at the LED element 2, and is formed by injection molding.

Advantages of the Light Emitting Device 100

According to the light emitting device 100 described above, the following advantages can be obtained.

(1) An optical system with an optional optical shape surface can be easily formed on the glass sealed LED by injection molding using a resin material such as acrylic resin and a polycarbonate resin. The $Al_2O_3$ substrate 3 has mechanical strength to withstand a pressure keeping during the injection molding and an external pressure applied by the injection of resin, so that it can be combined with the transparent resin 9 with the optional optical shape freely selected according to application of the light emitting device 100. Since the LED element 2 is covered by the glass sealing portion 6, it is not damaged even when the injection speed of resin material increases.

(2) The glass sealed LED 1 is overmolded by the resin material, so that the glass sealing portion 6 can have an enhanced humidity resistance as well as protection from deterioration.

(3) The transparent resin 9 is disposed on the LED element 2 through the glass sealing portion 6, so that it is possible to use even a resin material which cannot directly seal the LED element 2 in terms of the optical deterioration. Thus, the design freedom can be enhanced. For example, the transparent resin 9 may be formed of a colored transparent resin material.

(4) The LED 1 has a rectangular parallelepiped shape which can be most easily mass-produced, and is formed as a compact package which can be a great deal yielded from the same ceramic substrate with a low cost. By sealing it with the resin, light from the LED element 2 can be externally radiated substantially without being refracted at the interface of the LED 1 and the transparent resin 9, and a size necessary for forming the optical surface can be ensured. That is, it can be formed more easily and at lower cost than formed to have the same shape and size by using only the glass material.

Although the above light emitting device 100 is sealed with the acrylic resin, it may be sealed with an epoxy resin. The other molding method such as transfer molding and potting molding can be also adopted therefor. The form of the optical surface is not limited to hemispherical, but may be another shape.

The transparent resin 9 may include a phosphor. The phosphor may be a YAG (Yttrium Aluminum Garnet) phosphor, a silicate phosphor, or a mixture of the YAG phosphor and the silicate phosphor at a predetermined ratio.

Second Embodiment

Figure 5A:
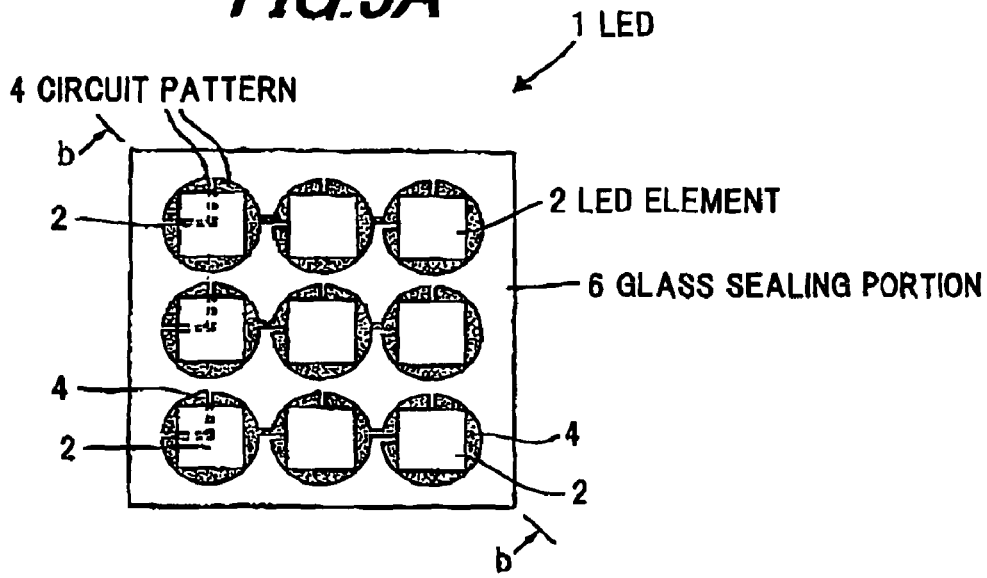
FIG. 5A is a plan view showing an LED as a solid state device in a second preferred embodiment according to the invention.
Figure 5B:
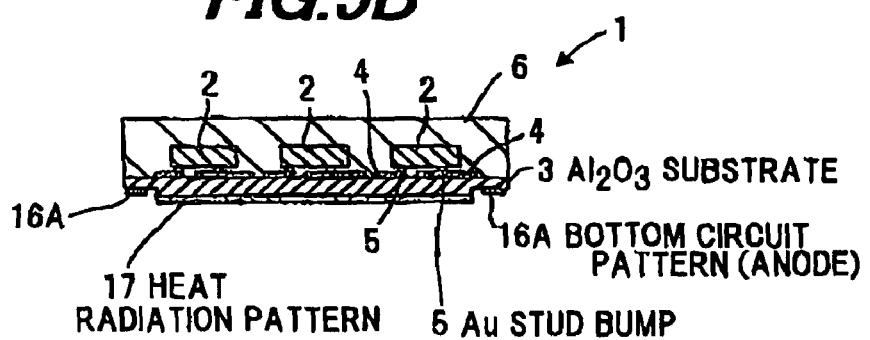
FIG. 5B is a longitudinal cross sectional view showing the LED in the second preferred embodiment according to the invention.
Figure 5C:
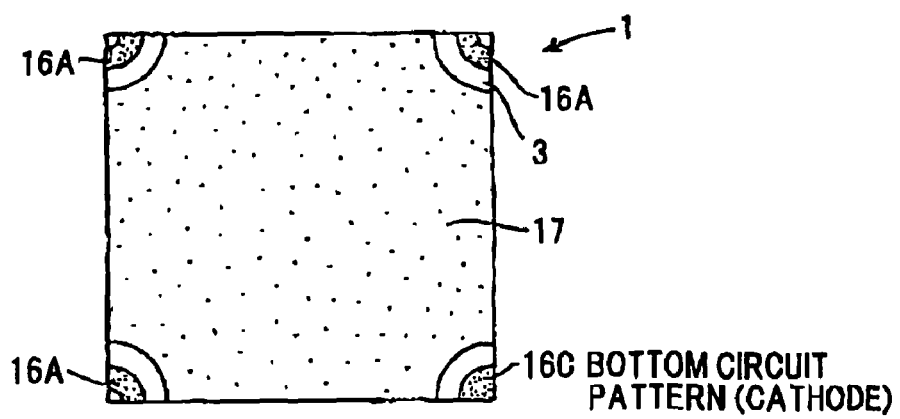
FIG. 5C is a bottom view showing the LED in the second preferred embodiment according to the invention.

FIG. 5A is a plain view showing an LED as a solid state device in the second preferred embodiment according to the invention, FIG. 5B is a longitudinal cross sectional view showing the LED, and FIG. 5C is a bottom view showing the LED.

Composition of LED 1

As shown in FIG. 5A, 5B, the LED 1 comprises plural GaN based LED elements 2 of flip-chip type, a $Al_2O_3$ substrate 3 multilayered and formed a square at a plain view, mounting the plural LED elements 2, and a circuit pattern 4 made of tungsten (W), formed on the surface of or in the $Al_2O_3$ substrate 3. Further, Ni plating and Au plating are conducted in the circuit pattern 4. The LED 1 further comprises an Au stud bump 5 electrically connecting the LED element 2 to the circuit pattern 4, a glass sealing portion 6 made of a $B_2O_3$—$SiO_2$—$Li_2O$—$Na_2O$—$ZnO$—$Nb_2O_5$ based heat melting glass for sealing the LED element 2 and being bonded to the $Al_2O_3$ substrate 3, and bottom circuit patterns 16A, 16B exposed at an intermediate layer of the multilayer and at the four corners of the bottom of the $Al_2O_3$ substrate 3. The $B_2O_3$—$SiO_2$—$Li_2O$—$Na_2O$—$ZnO$—$Nb_2O_5$ based heat melting glass has the same composition as the glass material explained in the first embodiment. In this embodiment, the LED 1 further comprises a radiation pattern 17 formed of a copper (Cu) foil, disposed on the back surface of the $Al_2O_3$ substrate 3, and diffusing heat generated at the LED element 2 outward.

On the circuit pattern 4 patterned with circles at the surface of the $Al_2O_3$ substrate 3, the nine LED elements 2 (340 μm square) are arranged 3×3 in the length and width directions and compactly mounted through the stud bumps 5 at intervals of 600 μm in the length and width directions.

The $Al_2O_3$ substrate 3 has a multilayer structure including an internal wiring made of W, and a group of elements is, as shown in FIG. 5A, formed by connecting the laterally-rowed three LED elements 2 in series. As shown in FIG. 5C, the $Al_2O_3$ substrate 3 is formed such that an anode for the group of the LED elements 2 is connected with one of the bottom circuit pattern 16A and a cathode of the group of elements is connected with the bottom circuit pattern 16C. The bottom circuit patterns 16A for the anode are formed at three of the four corners of the bottom of the $Al_2O_3$ substrate 3, and the bottom circuit pattern 16C for the cathode is formed at the remaining corner. The anodes for the three groups of elements are each connected to the bottom circuit patterns 16A for the anode. Also, the cathodes for the three groups of elements are all connected to the bottom surface circuit pattern 16C for the cathode.

Advantages of the Second Embodiment

According to the second embodiment described above, the following advantages can be obtained.

(1) Although the plural LED elements 2 are compactly mounted at an arrangement pitch of less than two times the width of the LED element 2, the LED 1 can have good reliability without generating cracks since the LED element 2 and the glass sealing portion 6 has the similar thermal expansion coefficient (α). Further, good bonding strength can be secured between the glass sealing portion 6 and the $Al_2O_3$ substrate 3 since they have the similar thermal expansion coefficient.

(2) By using the $Al_2O_3$ substrate 3, a stable heat radiation performance can be obtained even when the GaN based LED elements 2 to cause a large heat generation are compactly mounted. The serial and parallel circuits can be easily patterned and the wiring can be easily drawn for conducting the electrolysis plating.

(3) The external electrical terminals are drawn out from the internal layer and the metallic radiation pattern 17 is mounted on the bottom surface, so that heat generated during the emission of the nine LED elements 2 mounted compactly can be rapidly conducted from the radiation pattern 17 to a heat sink etc.

The light emitting device 100 shown in FIG. 4 can be also formed by covering the LED 1 of the second embodiment with the transparent resin 9.

Third Embodiment

Figure 6:
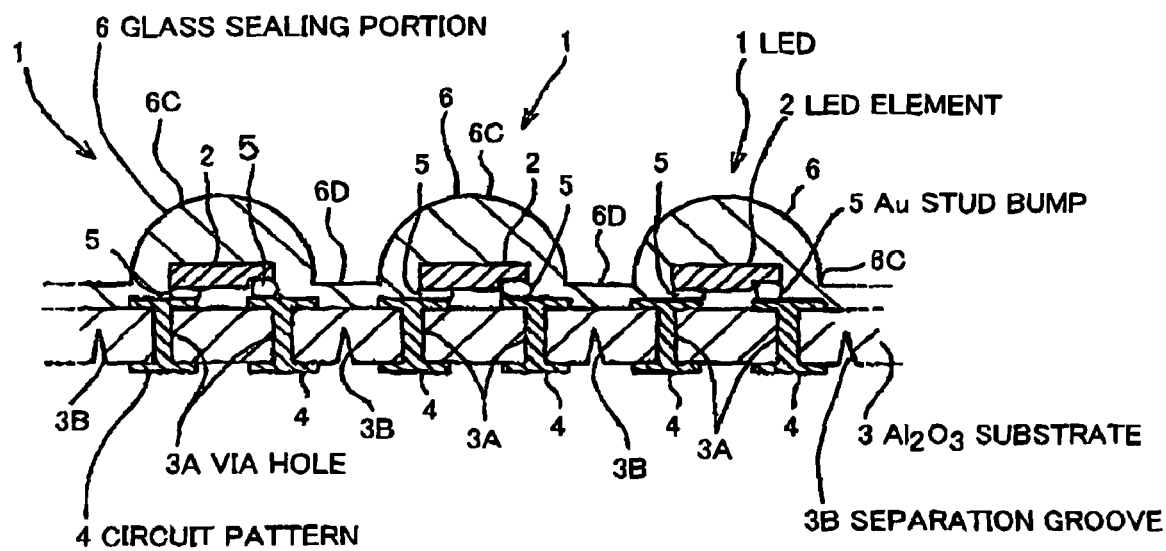
FIG. 6 is a longitudinal cross sectional view showing an LED as a solid state device in a third preferred embodiment according to the invention.

FIG. 6 is a longitudinal cross sectional view showing an LED as a solid state device in the third preferred embodiment according to the invention. In detail, FIG. 6 shows the plural LEDs 1 sealed by glass and formed on the wafer $Al_2O_3$ substrate 3.

Composition of LED 1

As shown in FIG. 6, the LED 1 comprises the flip-chip LED element 2 formed of the GaN based semiconductor material, the $Al_2O_3$ substrate 3 mounting the LED element 2 thereon, the circuit pattern 4 formed on the $Al_2O_3$ substrate 3, the Au stud bump 5 electrically connecting the LED element 2 and the circuit pattern 4, and the glass sealing portion 6 made of the $B_2O_3$—$SiO_2$—$Li_2O$—$Na_2O$—$ZnO$—$Nb_2O_5$ based heat melting glass, formed with an optical shape surface, for sealing the LED element 2 and being bonded to the $Al_2O_3$ substrate 3 by thermal compression. The $B_2O_3$—$SiO_2$—$Li_2O$—$Na_2O$—$ZnO$—$Nb_2O_5$ based heat melting glass has the same composition as the glass explained in the first embodiment.

The $Al_2O_3$ substrate 3 has separation grooves 3B formed at predetermined intervals thereon to define a substrate separation position when cutting the wafer after the glass sealing.

The glass sealing portion 6 is bonded on the surface of the $Al_2O_3$ substrate 3 by hot-pressing a preformed glass material with an optical shape surface 6C and a thin flat portion 6D which are previously formed by performing. The flat portion 6D is formed such that it has a thickness enough not to cause damage such as a crack in the LED 1 located near the separation groove 3B when separating the wafer by applying stress to the separation groove.

The LED 1 is formed such that the LED elements 2 are mounted and sealed by the glass sealing portion 6, stress is applied at the separation grooves 3B of the $Al_2O_3$ substrate 3, and the $Al_2O_3$ substrate 3 is segmented based on the concentration of stress, where the glass sealing portion 6 can be simultaneously separated at the flat portion 6D.

Advantages of the Third Embodiment

According to the third preferred embodiment described above, the following advantages can be obtained.

(1) The $Al_2O_3$ substrate 3 generally available is used and the LED elements 2 are sealed by the glass sealing portion 6 with the similar thermal expansion coefficient to the substrate 3. Therefore, internal stress during the processing can be reduced to enhance the reliability in glass sealing process, and the mass productivity can be enhanced.

(2) The $Al_2O_3$ substrate 3 has mechanical strength to withstand the scribing, so that the LED element 2 can be mounted at a narrower pitch than that in case of dicing which needs a cutting margin, whereby the production yield can be increased. For example, in case of the small-size LED 1 where the LED elements 2 with a standard size (0.3 mm square) are sealed by the glass material at pitches of 0.5 mm, in case of using a sealing glass and a ceramic substrate with a thermal expansion coefficient of about $13 \times 10^{-6}/° C.$, cracks may occur due to the difference in thermal expansion coefficient between the sealing glass and the LED elements 2 when the LED elements 2 are mounted on the ceramic substrate at pitches of 0.5 mm without a cutting margin and glass sealing is then conducted. However, in this embodiment, since the glass sealing portion 6 and the LED elements 2 have the similar thermal expansion coefficients and the glass sealing portion 6 and the $Al_2O_3$ substrate 3 have only a small difference in thermal expansion coefficient even if the bonding area therebetween is reduced, the peeling of the glass sealing portion 6 from the $Al_2O_3$ substrate 3 and cracks in the glass sealing portion 6 due to the glass sealing and the scribe process do not occur.

(3) In case of separating the LED 1 by the dicing, the residual strain may occur in the glass when cutting the wafer by a dicer, so that defects may occur in the glass sealing portion 6 by the heat shock. However, in case of separating the LED 1 by the scribing, the residual strain is reduced to cause no defects.

The LED 1 can be separated by the other method than the scribing, e.g., by using a laser beam.

Fourth Embodiment

Figure 7:
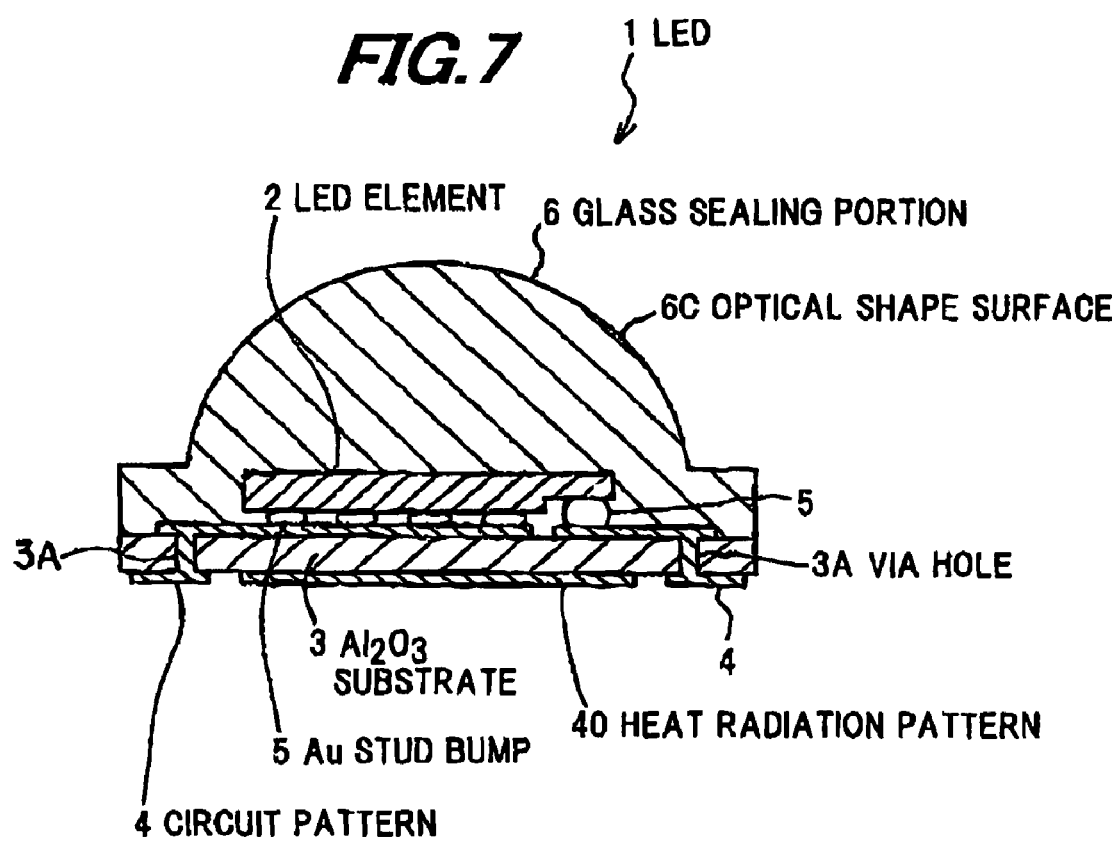
FIG. 7 is a longitudinal cross sectional view showing an LED mounting a large size LED element (1 mm square) as a solid state device in a fourth preferred embodiment according to the invention.

FIG. 7 is a longitudinal cross sectional view showing an LED, where an LED element with a large size (1 mm square) is mounted, as a solid state device in the fourth preferred embodiment according to the invention.

Composition of LED 1

The LED 1 comprises the large-size flip-chip LED elements 2 formed of the GaN based semiconductor material, the $Al_2O_3$ substrate 3 mounting the LED element 2 thereon, the circuit pattern 4 formed on the $Al_2O_3$ substrate 3, a heat radiation pattern 40 with a predetermined area, formed of a high thermal conduction material such as a copper foil and formed on the external connection side (bottom side) of the $Al_2O_3$ substrate 3, the Au stud bump 5 electrically connecting the LED elements 2 and the circuit pattern 4, and the glass sealing portion 6 for sealing the LED element 2 and bonded to the $Al_2O_3$ substrate 3, formed of the $B_2O_3$—$SiO_2$—$Li_2O$—$Na_2O$—$ZnO$—$Nb_2O_5$ based heat melting glass and provided with an optical shape surface. The $B_2O_3$—$SiO_2$—$Li_2O$—$Na_2O$—$ZnO$—$Nb_2O_5$ based heat melting glass has the same composition as the glass explained in the first embodiment.

Advantages of the Fourth Embodiment

According to the fourth embodiment described above, the reliable LED 1 can be obtained without generating cracks due to the difference in thermal expansion coefficient between the $Al_2O_3$ substrate 3 and the glass sealing portion 6 even when using the large size LIED element 2. When the stress-free state during the glass sealing process is shifted to room temperature, stress will be caused in proportion to the size of the LED element 2. In general, since glasses are a harder material than resins, cracks may be caused due to, particularly, tensile stress and shear stress. However, it is confirmed by the inventors that the LED element 2 (1 mm square) can be sealed by the $Al_2O_3$ substrate 3 and the glass sealing portion 6 of this embodiment without causing cracks.

The light emitting device 100 shown in FIG. 4 can be also formed by using the LED 1 of the fourth embodiment and the transparent resin 9 as shown.

Fifth Embodiment

An LED is formed such that, using the large-size LED elements 2 explained in the fourth embodiment, the nine GaN based LED elements 2 are mounted 3×3 in the length and width directions on the $Al_2O_3$ substrate 3 like the LED 1 as explained in the second embodiment, and it is sealed with the glass sealing portion 6 formed of the $B_2O_3$—$SiO_2$—$Li_2O$—$Na_2O$—ZnO—$Nb_2O_5$ based heat melting glass.

Advantages of the Fifth Embodiment

According to the fifth embodiment described above, even when the plural large-size LED elements 2 are mounted, the stable glass sealing property can be obtained as described in the fourth embodiment to provide the reliable LED 1.

Instead of the $Al_2O_3$ substrate 3 as explained in the fifth embodiment, another substrate may be used which is formed of a higher thermal conduction material. The higher thermal conduction substrate may be formed of, e.g., BeO (with a thermal expansion coefficient ($\alpha$) of $7.6 \times 10^{-6}/°$ C. and a thermal conductivity coefficient of 250 W/(m·k)). The BeO substrate can have a good glass sealing property since the thermal expansion coefficient ($\alpha$) thereof is similar to the glass sealing portion 6.

Also, the higher thermal conduction substrate may be formed of, e.g., W—Cu. When the W—Cu substrate is a W90-Cu10 substrate (with a thermal expansion coefficient ($\alpha$) of $6.5 \times 10^{-6}/°$ C. and a thermal conductivity coefficient of 180 W/(m·k) or a W85-Cu15 substrate (with a thermal expansion coefficient ($\alpha$) of $7.2 \times 10^{-6}/°$ C. and a thermal conductivity coefficient of 190 W/(m·k), the high thermal conductivity can be provided as well as good bonding strength to the glass sealing portion. Thus, it can be sufficiently adapted for a high brightness or high output type LED.

In the above embodiments, the plate glass material is bonded to the $Al_2O_3$ substrate 3 by the hot pressing. Alternatively, a powder glass material can be melted and hardened on the $Al_2O_3$ substrate 3. In case of forming the glass sealing portion 6 by using the powder glass material, the design freedom in forming the glass sealing portion 6 can be enhanced as compared to the case of using the plate glass material.

Figure 8:
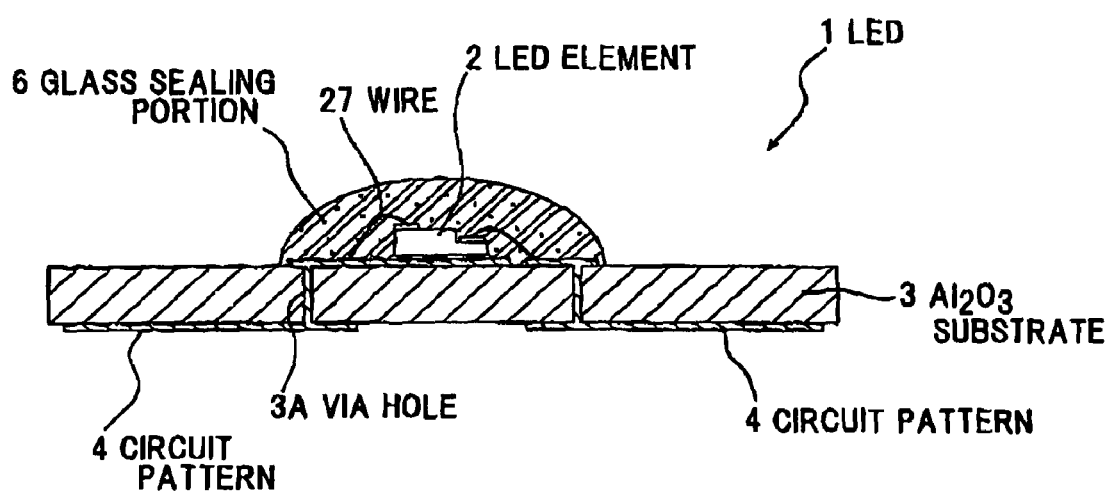
FIG. 8 is a longitudinal cross sectional view showing an LED with a glass sealing portion formed of a powder glass material in a modification according to the invention.

FIG. 8 is a longitudinal cross sectional view showing an LED with the glass sealing portion formed of the powder glass material. In FIG. 8, the LED 1 has the GaN based LED element 2 face-up mounted on the $Al_2O_3$ substrate 3. The glass sealing portion 6 of the LED 1 has the lens-like outer surface, so that the light extraction efficiency can be enhanced. As shown in FIG. 8, the electrodes of the LED element 2 are connected with the circuit pattern 4 by wires 27 because of using the face-up mounting. In the LED 1, since the glass sealing portion 6 is formed by using the powder glass material, no excessive internal stress will occur to the wires to prevent the breaking of the wires.

In the first to fifth embodiments, the LED using the LED element is exemplified as a solid state component. However, the solid state component is not limited to the LED element, and for example, the other optical elements such as a light receiving element and a solar battery can be also used therein.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A solid state device, comprising:
   a solid state component;
   a power receiving/supplying portion that mounts the solid state component thereon for receiving/supplying electrical power from/to the solid state component; and
   a glass sealing portion that seals the solid state component and comprises a $B_2O_3$—$SiO_2$—$Li_2O$—$Na_2O$—ZnO—$Nb_2O_5$ based glass,
   wherein the glass comprises 21 wt % to 23 wt/O of $B_2O_3$, 11 wt % to 13 wt % of $SiO_2$, 1 wt % to 1.5 wt % of $Li_2O$, and 2 wt % to 2.5 wt % of $Na_2O$.

2. The solid state device according to claim 1, wherein:
   the glass comprises 48 wt % to 51 wt % of ZnO, and 11.5 wt % to 12 wt % of $Nb_2O_5$.

3. The solid state device according to claim 2, wherein:
   the glass comprises 3.5 wt % to 4 wt % of $Li_2O$ and $Na_2O$ in sum content.

4. The solid state device according to claim 1, wherein:
   the glass comprises a yielding point of not more than 540° C.

5. The solid state device according to claim 1, wherein:
   the glass comprises a thermal expansion coefficient of not more than $7.0 \times 10^{-6}/°$ C.

6. The solid state device according to claim 1, wherein:
   the glass sealing portion and the solid state component satisfy a relationship between thermal expansion coefficients thereof that a ratio of a lower one of the thermal expansion coefficients to a higher one thereof is not less than 0.85.

7. The solid state device according to claim 6, wherein:
   the solid state component comprises a size of not less than 1 mm.

8. The solid state device according to claim 6, wherein:
   the power receiving/supplying portion compactly mounts a plurality of the solid state components thereon.

9. The solid state device according to claim 1, wherein:
   the solid state component is flip-chip mounted.

10. The solid state device according to claim 9, further comprising:
    two bumps through which the solid state component is mounted, the bumps each being formed at an anode side and at a cathode side.

11. The solid state device according to claim 1, wherein:
    the power receiving/supplying portion comprises an inorganic material substrate comprising a conductive pattern to receive/supply an electrical power from/to the solid state component, and
    the glass sealing portion and the solid state component satisfy a relationship between thermal expansion coefficients thereof that a ratio of a lower one of the thermal expansion coefficients to a higher one thereof is not less than 0.85.

12. The solid state device according to claim 11, wherein:
    the inorganic material substrate comprises a first conductive pattern formed on a mounting side of the solid state component, a second conductive pattern formed on an opposite side of the mounting side, and a third conductive pattern electrically connecting the first conductive pattern with the second conductive pattern.

13. The solid state device according to claim 11, wherein:
the inorganic material substrate comprises an alumina substrate.

14. The solid state device according to claim 1, wherein:
the glass sealing portion comprises a coating material that comprises humidity resistance, acid resistance and alkali resistance, and is formed on a surface thereof.

15. The solid state device according to claim 1, wherein:
the solid state component comprises an optical element, and
the glass sealing portion comprises a transparent material.

16. The solid state device according to claim 15, wherein:
the optical element comprises a light emitting element.

17. The solid state device according to claim 16, wherein:
the glass sealing portion comprises a phosphor dispersed therein to emit a wavelength conversion light when excited by light emitted from the light emitting element.

18. The solid state device according to claim 16, wherein:
the glass sealing portion comprises an internal transmittance of not less than 90% per 1 mm thickness to light with a wavelength of 350 nm to 800 nm.

19. The solid state device according to claim 16, wherein:
the glass sealing portion comprises a refractive index of not less than 1.6.

20. The solid state device according to claim 16, wherein:
the light emitting element comprises a GaN based LED element comprising a growth substrate and a GaN based semiconductor layer formed on the growth substrate.

21. The solid state device according to claim 20, wherein:
the growth substrate comprises a refractive index of not less than 1.8.

22. The solid state device according to claim 15, wherein:
the optical element comprises a light receiving element.

23. The solid state device according to claim 1, wherein:
the glass sealing portion is overmolded by a resin at a surface thereof.

24. The solid state device according to claim 1, wherein:
the glass further comprises $Bi_2O_3$.

* * * * *